United States Patent
Kinoshita et al.

(10) Patent No.: US 7,569,879 B2
(45) Date of Patent: Aug. 4, 2009

(54) NONVOLATILE SEMICONDUCTOR MEMORY DEVICE AND MANUFACTURING METHOD THEREOF

(75) Inventors: Atsuhiro Kinoshita, Kamakura (JP); Riichiro Shirota, Fujisawa (JP); Hiroshi Watanabe, Yokohama (JP); Kenichi Murooka, Yokohama (JP); Junji Koga, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 11/699,334

(22) Filed: Jan. 30, 2007

(65) Prior Publication Data

US 2007/0291539 A1    Dec. 20, 2007

(30) Foreign Application Priority Data

Feb. 1, 2006  (JP) .............................. 2006-024884

(51) Int. Cl.
    *H01L 29/788* (2006.01)
(52) U.S. Cl. .................. 257/314; 257/330; 257/331; 257/332; 257/E27.118; 257/E29.262
(58) Field of Classification Search ............. 257/330, 257/331, 332, E27.118, E29.262, 314
    See application file for complete search history.

(56) References Cited

U.S. PATENT DOCUMENTS

| | | | |
|---|---|---|---|
| 5,006,909 A | | 4/1991 | Kosa |
| 6,077,745 A | * | 6/2000 | Burns et al. .................. 438/270 |
| 6,756,633 B2 | * | 6/2004 | Wang et al. .................. 257/317 |
| 2006/0046391 A1 | * | 3/2006 | Tang et al. ................... 438/268 |

FOREIGN PATENT DOCUMENTS

JP    4-79369    3/1992

OTHER PUBLICATIONS

Chinese Patent Office Notification of the First Office Action issued in copending Application No. 200710007976.1 mailed May 16, 2008, and English language translation thereof.

* cited by examiner

*Primary Examiner*—Ngan Ngo
*Assistant Examiner*—Benjamin Tzu-Hung Liu
(74) *Attorney, Agent, or Firm*—Finnegan, Henderson, Farabow, Garrett & Dunner, L.L.P.

(57) ABSTRACT

A nonvolatile semiconductor memory device includes a semiconductor substrate, plural semiconductor columns arranged in a matrix form on the substrate, plural first conductive areas zonally formed in a column direction on the substrate between the semiconductor columns and functioning as word lines, plural second conductive areas formed at tops of the semiconductor columns, respectively, plural bit lines connecting the second conductive areas in a row direction, plural channel areas respectively formed in the semiconductor columns between the first and second conductive areas and contacting the first and second conductive areas, plural third conductive areas continuously formed via first insulating films above the substrate and opposite to the channel areas in the column direction between the semiconductor columns and functioning as control gates, and plural charge accumulation areas respectively formed via second insulating films at upper portions of the channel areas at a position higher than the third conductive areas.

19 Claims, 13 Drawing Sheets

NONVOLATILE SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2006-024884, filed Feb. 1, 2006, the entire contents of which are incorporated herein by reference.

BACKGROUND OF THE INVENTION

1. Field of the Invention

The present invention relates to an electrically rewritable nonvolatile semiconductor memory device (EEPROM) using a memory transistor having a charge accumulation layer and a control gate, and to a manufacturing method thereof.

2. Description of the Related Art

A memory cell of an EEPROM having a MOS transistor structure is known which has a charge accumulation layer and a control gate in a gate portion and which uses a tunnel current to inject a charge into the charge accumulation layer and to release a charge from the charge accumulation layer. This memory cell stores, as data "0" and "1", a difference of threshold voltages resulting from a difference in the charge accumulation state of the charge accumulation layer. For example, in order to inject electrons into a floating gate as the charge accumulation layer, source and drain diffusion layers and a substrate are grounded to apply a positive high voltage to the control gate. At this moment, electrons are injected from the substrate side into the floating gate by the tunnel current. Due to this injection of electrons, the threshold voltage of the memory cell moves in a positive direction. In order to release the electrons in the floating gate, the control gate is grounded to apply a positive high voltage to the source and drain diffusion layers or to the substrate. At this moment, the electrons are released from the floating gate to the substrate side by the tunnel current. Due to this release of electrons, the threshold voltage of the memory cell moves in a negative direction.

However, along with recent marked advancement and digitalization of the information-oriented society, rapid progress is made in the miniaturization and capacity increase of the nonvolatile semiconductor memory device as described above, and product development is gradually becoming more difficult due to problems associated with the miniaturization, such as short channel effect and inter-cell interference effect. The short channel effect is one of the great problems among others, and this causes, for example, deterioration of an on-off ratio, resulting in a significant decrease in the performance as the memory.

In view of such problems, in order to achieve higher density through the miniaturization while suppressing the short channel effect, a cell structure has been proposed wherein a columnar channel provided vertically to a substrate is enclosed by a floating gate and a control gate (refer to JP A 4-79369 (KOKAI).

However, in the cell structure of the above patent document, the control gate and the floating gate are stacked when viewed from the channel in order to increase capacity coupling between the control gate and the floating gate, and in such an array structure, the distance between the cells is desirably about the same as the size of the cell itself to sufficiently increase the density of the cells. However, when employing an actually used size, for example, a cell size and cell pitch of 45 nm or less, it is currently very difficult to create the structure as proposed into such an extremely thin area.

Furthermore, it is essential that a common source and drains for the individual cells be used in the structure in the above patent document. However, when such a structure is employed, there has been a problem that apparent resistance of a cell to be read from changes due to the information (whether "0" or "1") on other electrically connected cells, and the reading becomes difficult if an actual number (e.g., about several hundred to several thousand) of cells are connected to one word line. In such a case, if the number of cells to be connected to the word line is decreased, the area occupied by, for example, peripheral circuits will be vast, which makes it impossible to increase capacity per unit area.

As described above, to achieve the miniaturization and higher capacity of the EEPROM while effectively suppressing the short channel effect, there are problems such as difficulty in manufacture or difficulty in increasing capacity. Therefore, it has been desired to achieve a semiconductor nonvolatile memory device that is easy to manufacture and capable of increasing capacity while effectively suppressing the short channel effect.

BRIEF SUMMARY OF THE INVENTION

According to a first aspect of the invention, there is provided a nonvolatile semiconductor memory device which includes:

a semiconductor substrate;

a plurality of semiconductor columns arranged in a matrix form on the semiconductor substrate;

a plurality of first conductive areas which are formed in a stripe form in a column direction on the semiconductor substrate between the plurality of semiconductor columns and which function as word lines;

a plurality of second conductive areas formed at tops of the plurality of semiconductor columns, respectively;

a plurality of bit lines connecting the plurality of second conductive areas in a row direction;

a plurality of channel areas which are respectively formed in the plurality of semiconductor columns between the first conductive areas and the second conductive areas and which contact the first conductive areas and the second conductive areas;

a plurality of third conductive areas which are continuously formed via first insulating films above the semiconductor substrate and opposite to the plurality of channel areas in the column direction between the plurality of semiconductor columns and which function as control gates; and a plurality of charge accumulation areas respectively formed via second insulating films at an upper portion of the plurality of channel areas at a position higher than the plurality of third conductive areas.

According to a second aspect of the invention, there is provided a method of manufacturing a nonvolatile semiconductor memory device, which includes:

dispersing minute semiconductor particles covered with insulating films on a semiconductor substrate;

growing, on the semiconductor substrate, a conductor layer which is in Schottky contact with the semiconductor substrate, and embedding the minute semiconductor particles therein;

selectively digging into a surface of the semiconductor substrate, forming a plurality of semiconductor plates aligned in a direction parallel to bit lines, and embedding spaces between the plurality of semiconductor plates with first insulating films;

providing a plurality of parallel grooves in a direction parallel to a word line direction intersecting with the bit lines, and processing the semiconductor plates to form a plurality of semiconductor columns;

implanting impurities into a bottom of the plurality of parallel grooves to form a plurality of word lines;

forming control gate lines via second insulating films in the plurality of parallel grooves below the conductor layer;

embedding the plurality of parallel grooves with third insulating films to form the surfaces thereof into smoothed surfaces; and connecting the conductive layers remaining at tops of the plurality of semiconductor columns in a bit line direction to form the plurality of bit lines on the smoothed surfaces.

BRIEF DESCRIPTION OF THE SEVERAL VIEWS OF THE DRAWING

FIGS. 3A to 3C are diagrams for explaining the principle of operation in the first embodiment, wherein FIG. 3A is a schematic configuration diagram, and FIGS. 3B and 3C show in energy band diagrams the difficulty or facility in the flow of a current in the above configuration;

FIGS. 5A and 5B are diagrams for explaining a process of manufacturing the semiconductor memory device in the first embodiment, wherein FIG. 5B is a plan view, and FIG. 5A is a sectional view along the 5A-5A line in FIG. 5B;

FIGS. 6A and 6B are diagrams for explaining a process following FIGS. 5A and 5B, wherein FIG. 6B is a plan view, and FIG. 6A is a sectional view along the 6A-6A line in FIG. 6B;

FIGS. 8A and 8B are diagrams for explaining a process following FIG. 7, wherein FIG. 8B is a plan view, and FIG. 8A is a sectional view along the 8A-8A line in FIG. 8B;

FIGS. 10A and 10B are diagrams for explaining a process following FIG. 9, wherein FIG. 10B is a plan view, and FIG. 10A is a sectional view along the 10A-10A line in FIG. 10B;

FIGS. 11A and 11B are diagrams for explaining a process following FIGS. 10A and 10B, wherein FIG. 11B is a plan view, and FIG. 11A is a sectional view along the 11A-11A line in FIG. 11B;

DETAILED DESCRIPTION OF THE INVENTION

A nonvolatile semiconductor memory device in embodiments of the present invention described so far employs a columnar channel, so that it is not the length of the channel but the sectional area of the channel that is scaled even if the miniaturization and capacity increase are achieved. This means that resistance to short channel effect is more improved as further miniaturization is achieved, so that trade-off between higher density and the short channel effect can be fundamentally resolved.

A floating gate and a control gate are arranged in parallel when viewed from the channel, such that manufacture is far easier than when they are stacked. Moreover, since reading is performed not by surface channel resistance of a MOS structure but by a resistance change in a diode, reading does not become difficult even if a large number of cells are connected to one word line.

As described above, according to the embodiments of the present invention, it is possible to achieve a semiconductor nonvolatile memory device that is easy to manufacture and capable of increasing capacity while effectively suppressing the short channel effect.

The embodiments according to the present invention will hereinafter be described with reference to the drawings. It is to be noted that the present embodiments do not limit the present invention. In the following embodiments, components of a p-type semiconductor may be replaced with those of an n-type semiconductor, and components of the n-type semiconductor may be replaced with those of the p-type semiconductor.

First Embodiment

Figure 1:
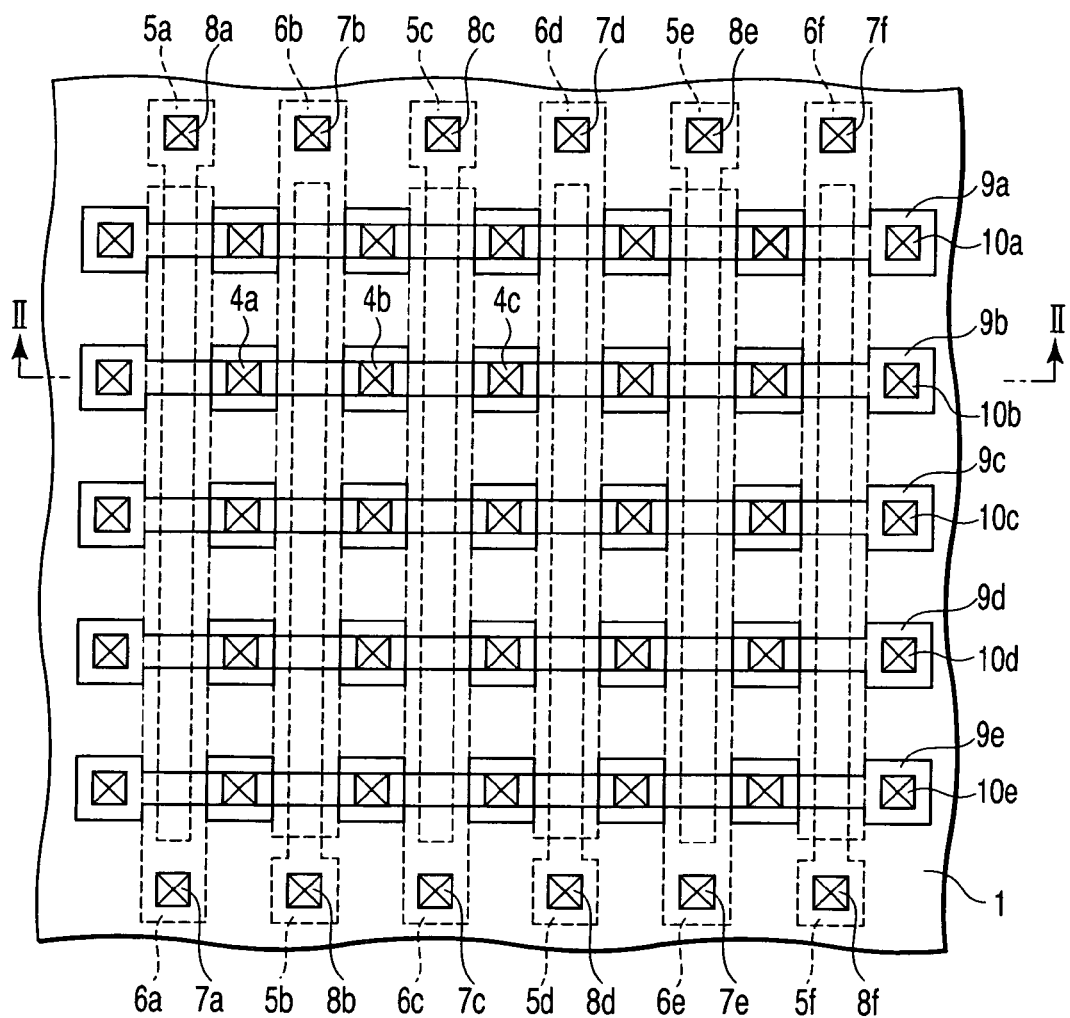
FIG. 1 is a schematic plan view of a nonvolatile semiconductor memory device in a first embodiment of the present invention.

In a first embodiment, a p-type silicon substrate is used as a semiconductor substrate. As shown in FIG. 1, a plurality of columnar silicon layers (semiconductor columns) 2 (2a to 2c) separated by lattice-shaped grooves and serving as channel areas is formed on a p-type silicon substrate 1. Further, contact layers 4 (4a to 4c) are formed on metal layers (second conductive areas) 3 (3a to 3c) serving as drains, and are connected with bit lines 9 (9a to 9e). The bit lines 9 are connected with a plurality of bit cell columns, and connected with bit line contacts 10 (10a to 10e) at both ends of an array.

The metal layers 3 and the channel areas 2 are in Schottky contact, so that a so-called midgap metal (a metal whose Fermi level is in the vicinity of the center of the bandgap of a semiconductor forming the channel areas when contacting the channel areas) such as NiSi or CoSi is used for the metal layers 3.

First $n^+$-type impurity areas (first conductive areas) 6 (6a to 6f) serving as common sources are formed on the bottom surface of the columnar silicon layers 2. These areas are electrically connected with the cells linked to the same word line 6, and further connected to independent word line contacts 7 (7a to 7f) for the respective word lines.

Furthermore, control gates 5 (5a to 5f) (third conductive areas) made of $n^+$-type silicon or a metal are formed on the tops of the word lines so that the cell columns are interposed in between, and are connected with independent control gate contacts 8 (8a to 8e) in accordance with the respective word lines.

Floating gates (fourth conductive areas) 12 (12a to 12c) made of a conductor are formed between the columnar silicon layers 2 and the metal layers 3 via second insulating films 11 (11a to 11c). Further, first insulating films 13 (13a to 13d) are embedded between the respective columnar silicon layers.

In the present embodiment, the section of the floating gate is circular, but is not exclusively circular and may be square. Moreover, the position of the floating gate has to be such that the entire floating gate is within the silicon column 2 or the metal layer 3, that the lower end of the floating gate is higher than the upper end of the control gate 5 and that this lower end exists in at least the silicon column.

Furthermore, the columnar silicon layers 2 have to be fully depleted in operation. To this end, a width W of the channel area 2 has only to be equal to or less than half of a height H of the control gate 5. More specifically, W has only to be 15 nm or less as a practical range.

In the present embodiment, a charge in the floating gate 12 is used as information "0" or "1". It should be understood that not only the information with the two values "0" and "1" but also multilevel information may be used. Moreover, the contacts are alternately formed in the word lines 6 and the control gates 5, and this is designed to reduce a voltage drop and does not necessarily have to be in this manner.

Operations to read, write and erase the information in the present embodiment are performed as follows.

(Reading)

For example, when it is desired to read the cell having the floating gate 12b, a positive bias is applied to the control gates 5b and 5c. Then, an n-type inversion layer is produced in the channel layer 2b (channel in the same column). At the same time, a negative bias is applied to other control gates, thereby producing accumulation layers in the channels. At this point, a bias condition is selected such that no inversion layer is produced in the columns of 2a and 2c.

Next, all source electrodes are grounded, and a negative bias is applied to the bit line 9b, such that the channel with 12b only becomes a Schottky diode in a forward-bias state. At this moment, the current/voltage characteristic of this Schottky diode is greatly affected by the charge in the floating gate. That is, a high current flows when a positive charge is stored in the floating gate, whereas a significantly low current only flows when a negative charge is stored therein. Therefore, the intensity of a current can be read as information.

Figure 3A:
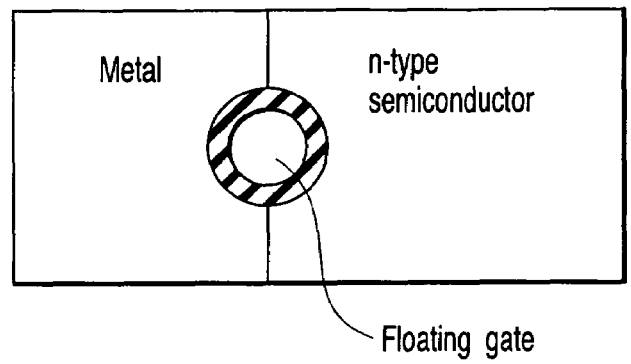
Figure 3B:
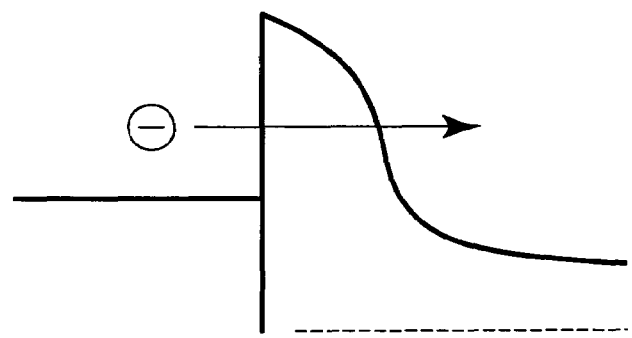
Figure 3C:
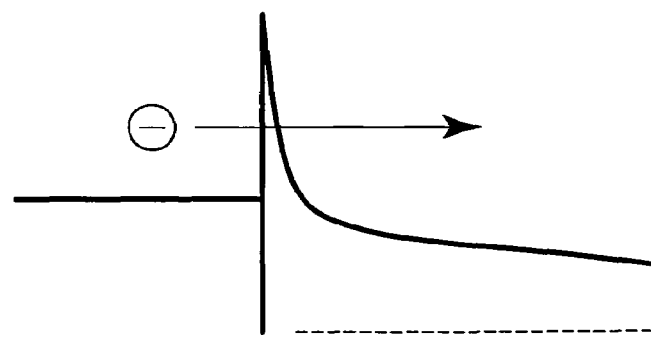

The above operation will be explained in more detail referring to FIG. 3. As shown in FIG. 3A, when a charge exists in the floating gate (charge accumulation area), they modulate potential therearound. In the case of a Schottky diode made of a metal and a semiconductor (n-type semiconductor in this case) as in the drawing, the potential will be as shown in FIGS. 3A and 3B depending on whether the charge existing in the charge accumulation area is positive or negative. FIG. 3B shows a case where the charge existing in the charge accumulation area is negative, and FIG. 3C shows a case where the charge is positive. Since the current flowing in the Schottky diode is greatly affected by the shape of the potential, the amount of flowing current changes to an extremely great extent even if the same negative bias is applied to both ends. In the case of FIG. 3B, the current does not easily run because the negative charge exists. The current easily flows when the positive charge exists as in FIG. 3C.

(Writing)

In the bias condition similar to that in reading, if a high negative bias is applied to the bit line 9b, the channel with 12b becomes a surface charge type transistor in which a high electric field is applied in the vicinity of the metal electrode (drain). At this moment, electrons with high energy are produced on the periphery of the floating gate due to impact ionization, and the electrons tunnel through the insulating film and are thus injected into the floating gate.

(Erasure)

In the present embodiment, the whole block is collectively erased. A positive bias is applied to all the control gates to form n-type inversion layers in all the cells. If a negative bias is applied to the source electrode and a positive bias is applied to the drain electrode, a high electric field is applied to the metal/semiconductor junction, and the negative charge is pulled from the floating gate.

As described above, in the present invention, any combination can be freely used as long as a two-terminal element is used in which a great difference is produced in the current/voltage characteristic due to the potential in the vicinity of the junction.

Figure 4:
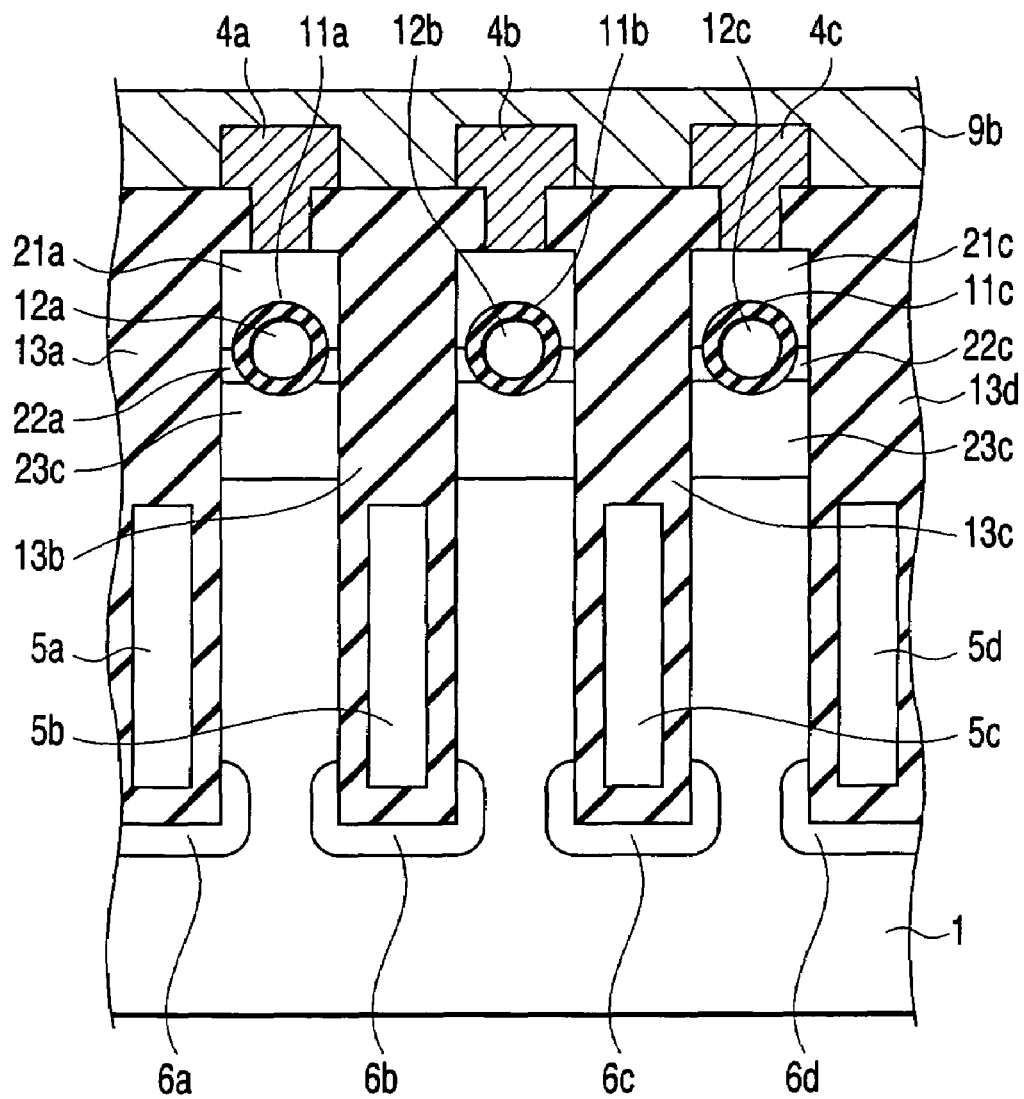
FIG. 4 is a schematic sectional view of a nonvolatile semiconductor memory device according to a modification of the first embodiment.

In other words, as shown in FIG. 4, a pin (nip) diode or a pnp (npn) diode can be used instead of the Schottky diode. That is, in FIG. 4, if 21 is a p-type semiconductor, 22 is an i-type semiconductor and 23 is an n-type semiconductor, then a pin diode is produced. On the other hand, if 21 is a p-type semiconductor, 22 is an n-type semiconductor and 23 is a p-type semiconductor, then a pnp diode is produced.

Furthermore, in the case of the pin diode, the position of the floating gate has to be such that the entire floating gate is within a pin layer, that the lower end of the floating gate is higher than the upper end of the control gate 5 and that this lower end exists in at least the n-layer 23. In the case of the pnp diode, the position of the floating gate has to be such that the entire floating gate is within a pnp layer, that the lower end of the floating gate is higher than the upper end of the control gate 5 and that this lower end exists in at least the n-layer 22.

Moreover, the word line 6 is made by use of an $n^+$-layer, but can also be made of a metal. In that case, since both an n type and p type can be electrically connected with the word line by the bias of the control gate, it is possible to use a scheme of erasure different from the above scheme. For example, the following modification is illustrated.

(Modification of Erasure)

A negative bias is applied to all the control gates to form p-type accumulation layers in all the cells. If a negative bias is applied to the source electrode and a positive bias is applied to the drain electrode, a high electric field is applied to a metal/semiconductor junction, and the negative charge is pulled from the floating gate.

(Manufacturing Method in First Embodiment)

Figure 2:
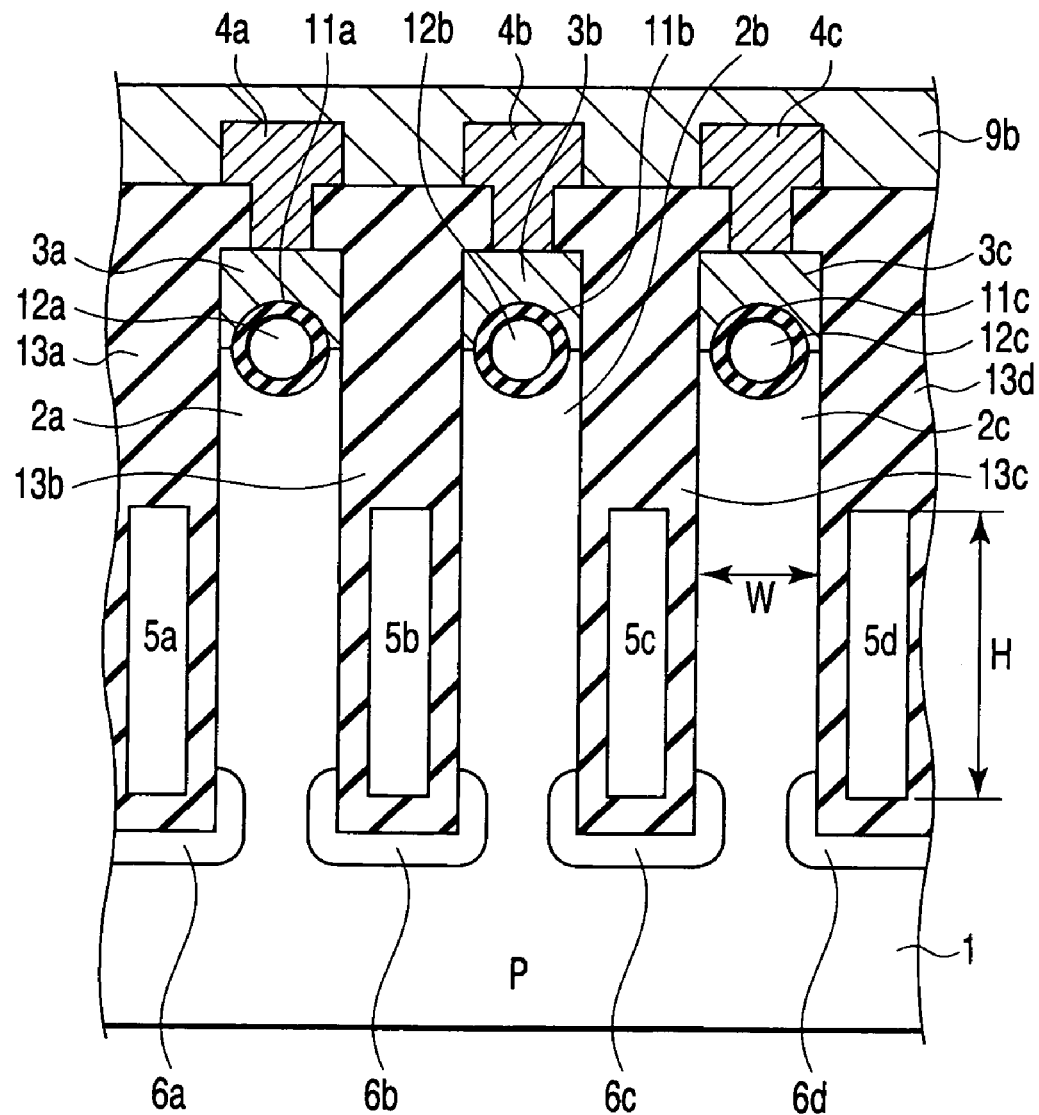
FIG. 2 is a schematic sectional view of the nonvolatile semiconductor memory device along the II-II line in FIG. 1 in the first embodiment.
Figure 5A:
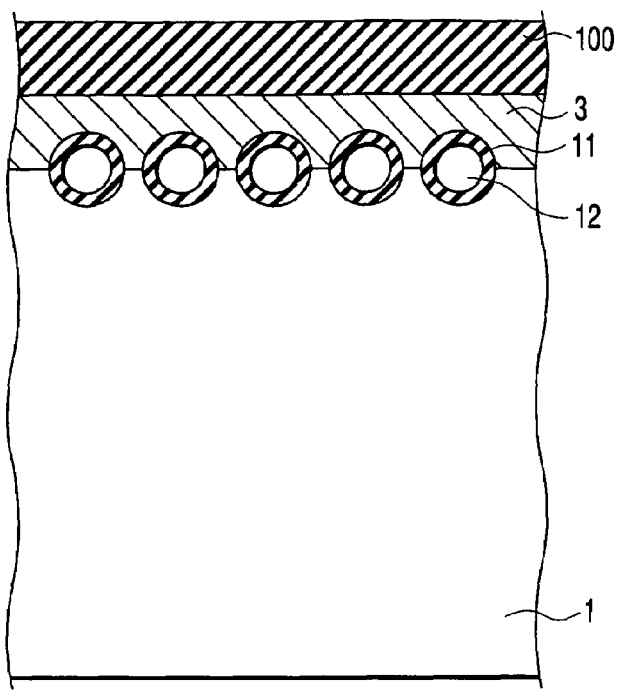
Figure 5B:
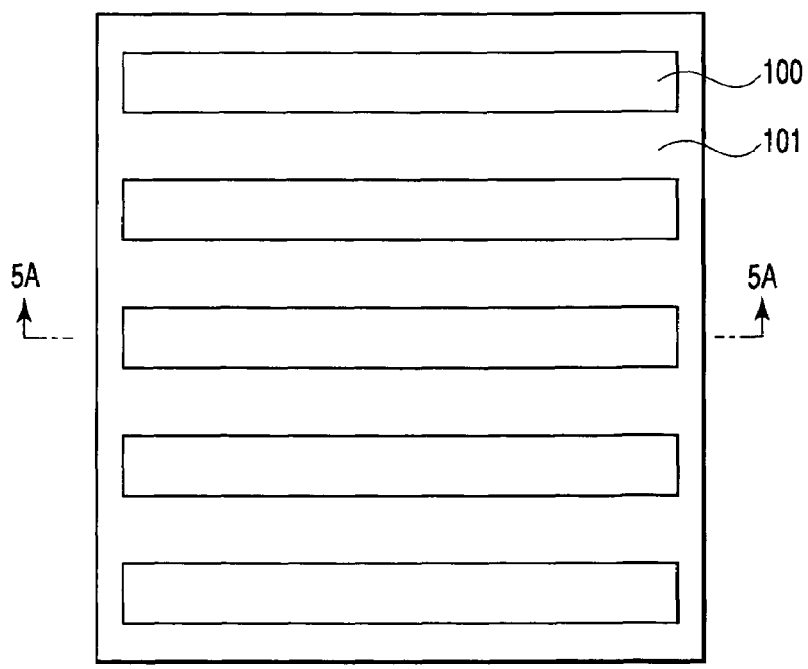

Next, a method of manufacturing nonvolatile semiconductor memory device shown in FIG. 2 will be described referring to FIGS. 5A and 5B to FIGS. 11A and 11B. First, as shown in FIGS. 5A and 5B, nanosilicon particles 12 covered with silicon oxide film 11 are dispersed on an Si substrate 1, and Si is epitaxially grown and embedded, and then Ni or the like is sputtered and heated, thereby forming an NiSi film 3 serving as a Schottky electrode. Further, a silicon nitride film 100 serving as a mask member is formed by, for example, plasma CVD. Then, the above-mentioned stack structure is processed in a direction parallel to the bit line by a known patterning technique, and embedded with silicon oxide 101, and then planarized by use of, for example, CMP.

Figure 6A:
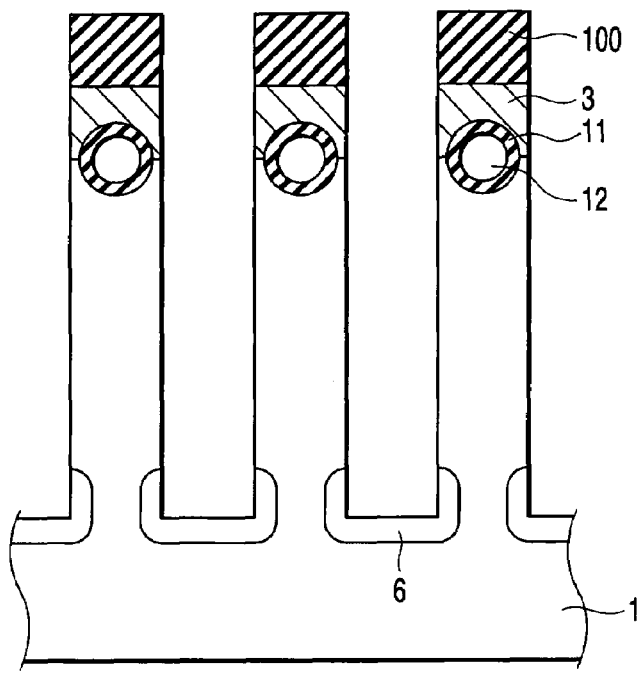
Figure 6B:
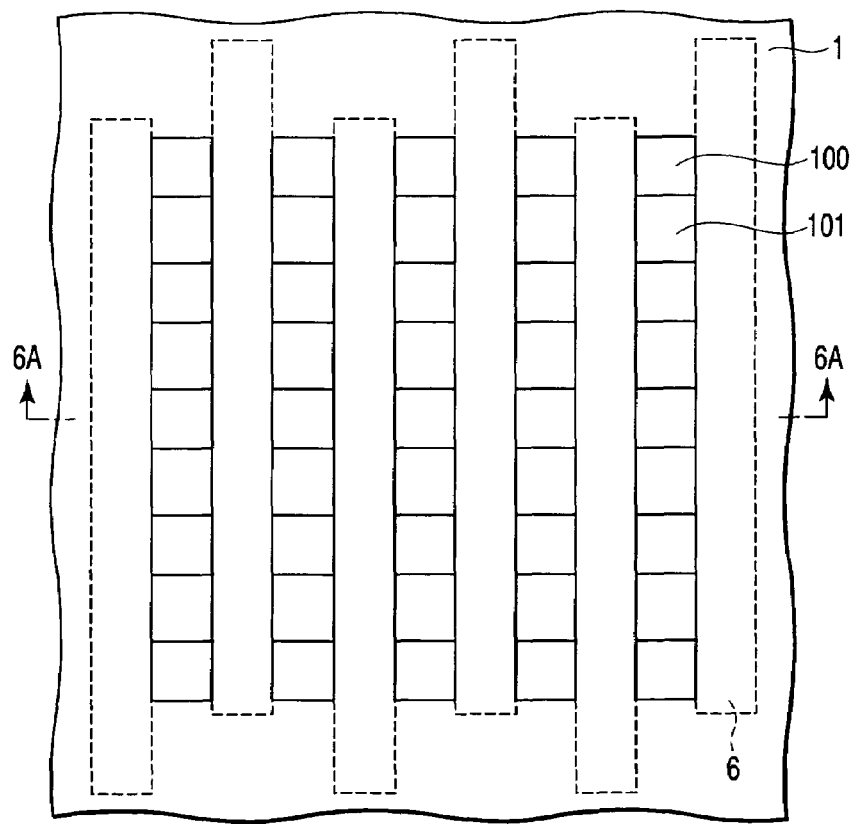

Furthermore, as shown in FIGS. 6A and 6B, the structure is patterned in a direction parallel to the word line by a known patterning technique, and a columnar structure (one side of a section is several ten nm) serving as a bit cell is formed, and then an $n^+$-area 6 serving as the word line is formed by, for example, ion implantation.

Figure 7:
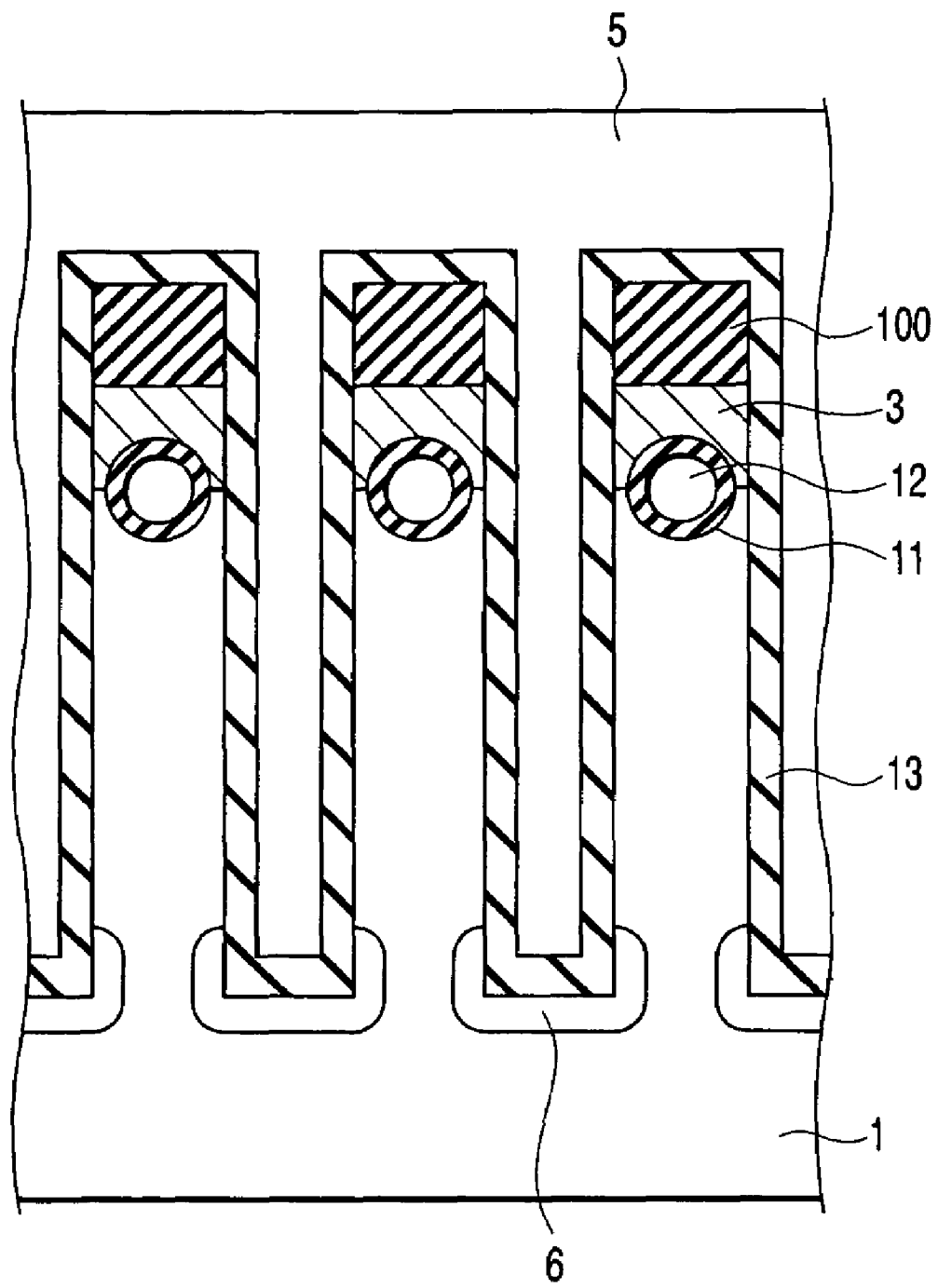
FIG. 7 is a sectional view for explaining a process following FIGS. 6A and 6B.

Then, as shown in FIG. 7, an insulating film 13 is deposited by, for example, a low pressure CVD (LPCVD), and a phosphorous (P)-doped polysilicon film 5 serving as a control gate is deposited and then planarized by use of, for example, chemical mechanical polishing (CMP).

Figure 8A:
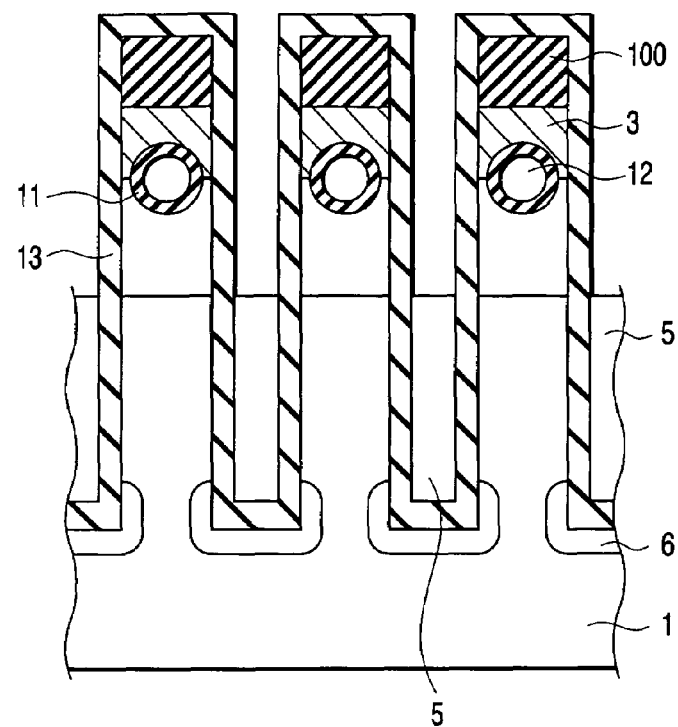
Figure 8B:
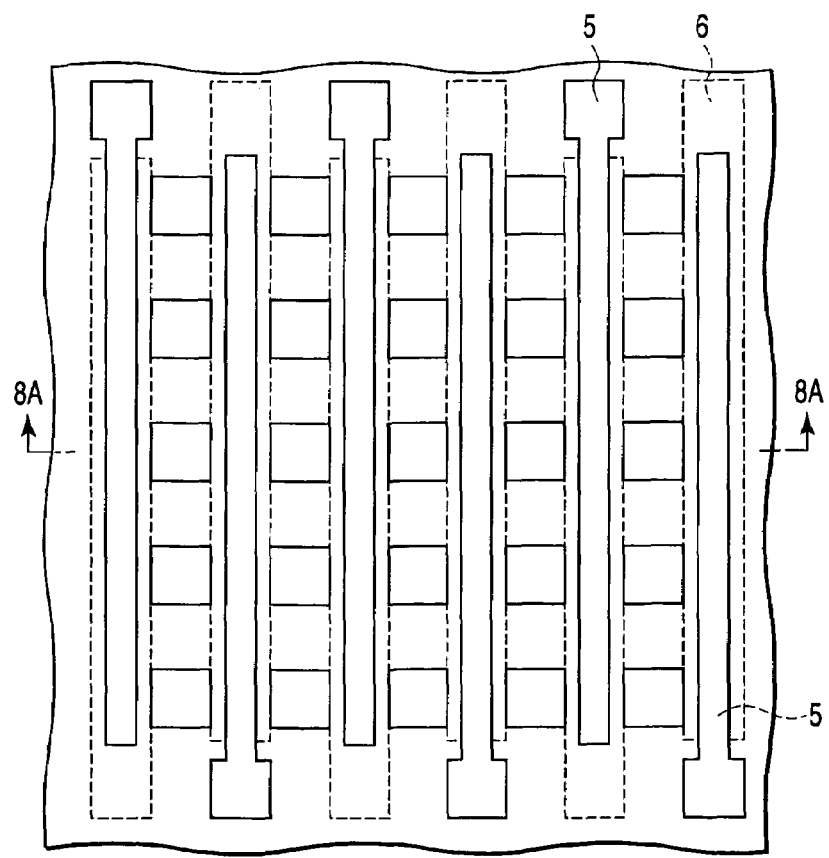

Then, as shown in FIGS. 8A and 8B, the P-doped polysilicon film 5 is processed up to a desired depth by, for example, known anisotropic etching, and unnecessary portions and pad portions are patterned by a known patterning technique, such that control gates 5 are formed.

Figure 9:
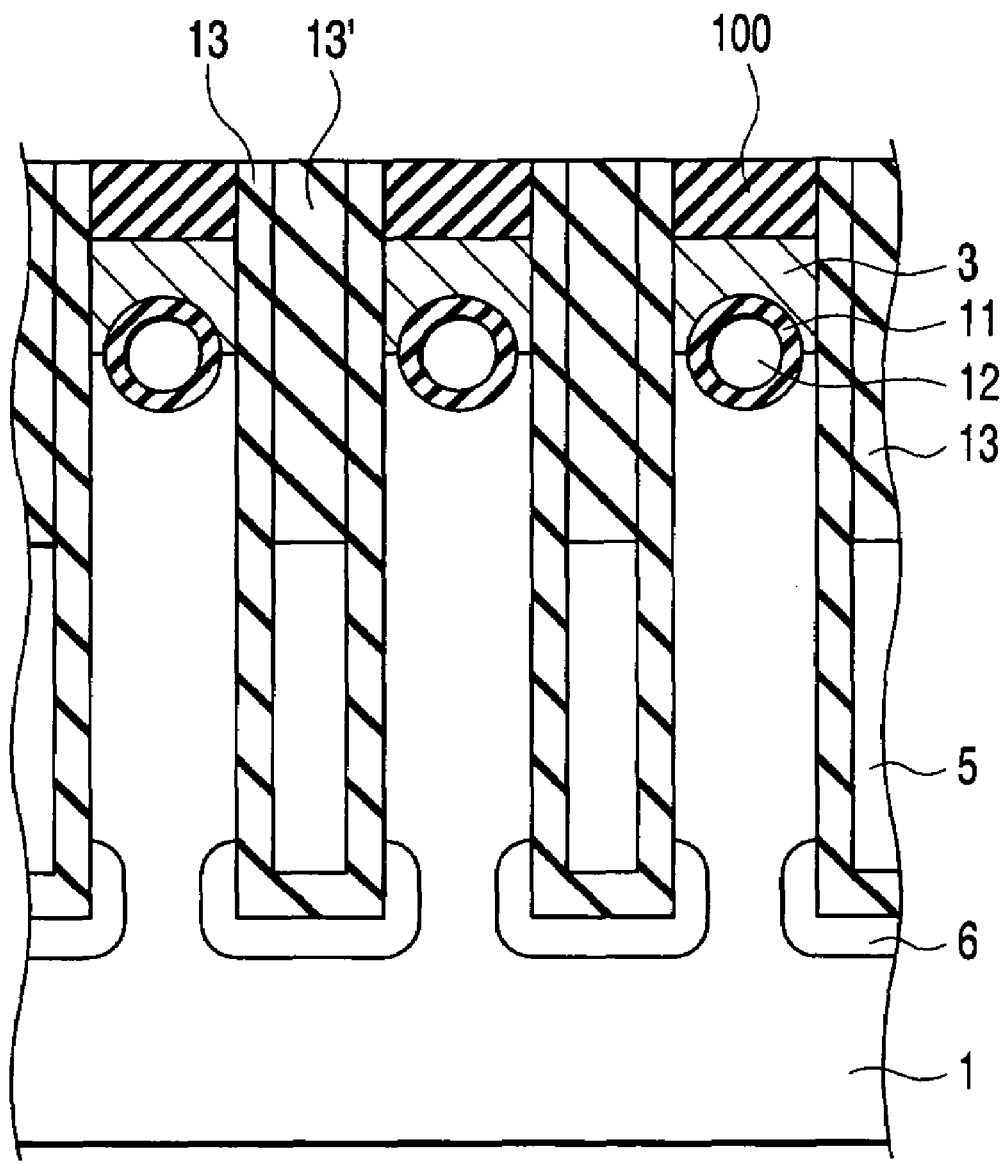
FIG. 9 is a sectional view for explaining a process following FIGS. 8A and 8B.
Figure 10A:
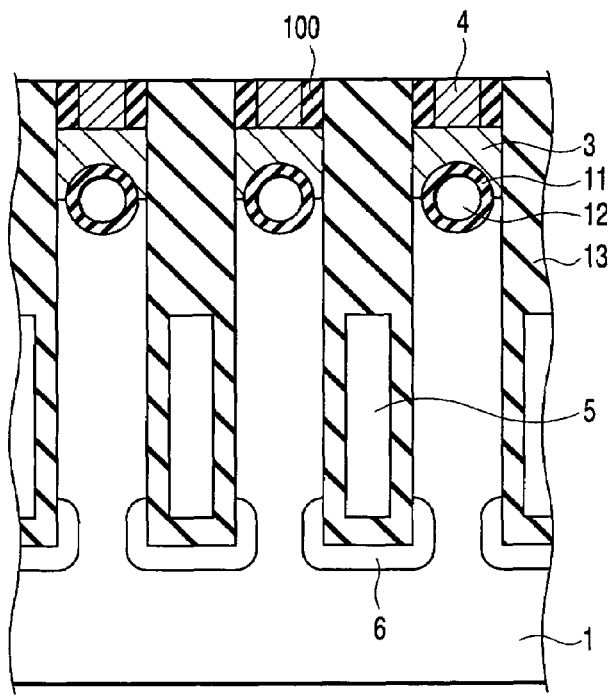
Figure 10B:
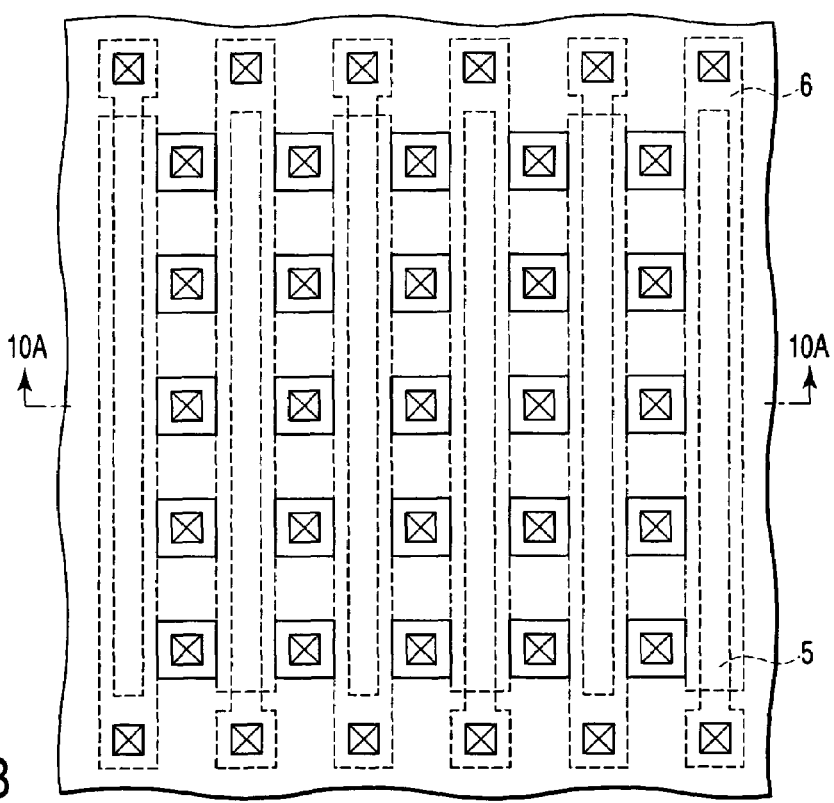
Figure 11A:
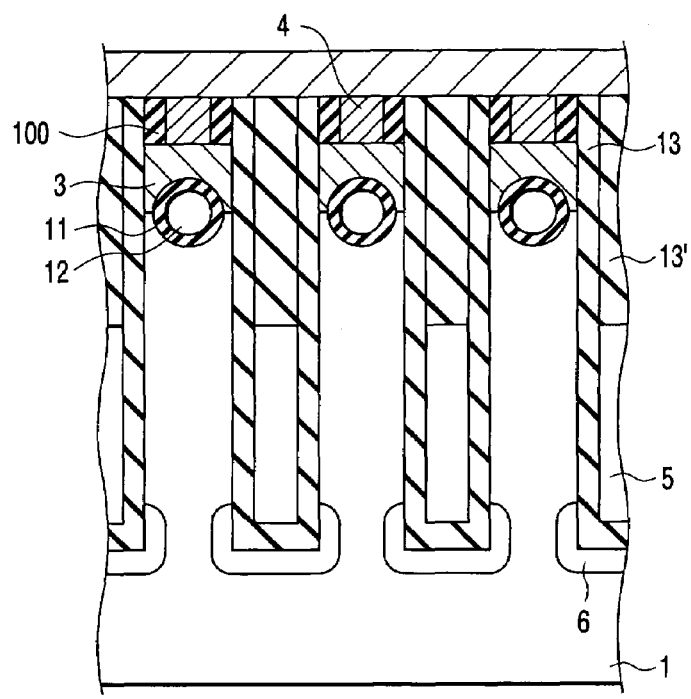
Figure 11B:
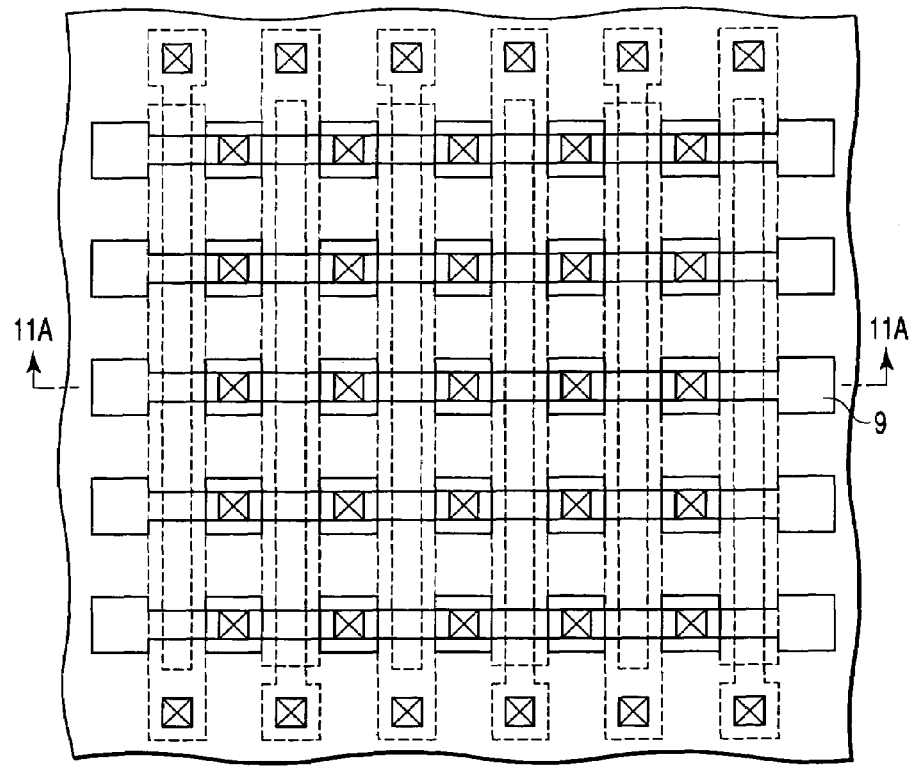

Then, as shown in FIG. 9, the above-mentioned structure is embedded with an insulating film 13', and an upper portion thereof is planarized by, for example, the CMP. Then, as shown in FIGS. 10A and 10B, a contact hole is opened for the Schottky electrode 3, the control gate 5 and the word line 6 in each cell by a known patterning technique, in which contact hole an electrode material such as tungsten is embedded to form, for example, a contact 4. Further, on the upper surface thereof, for example, aluminum is sputtered and patterned to form a bit line 9 connected with the contacts 4, such that a structure as in FIGS. 11A and 11B can be easily created.

Second Embodiment

Figure 12:
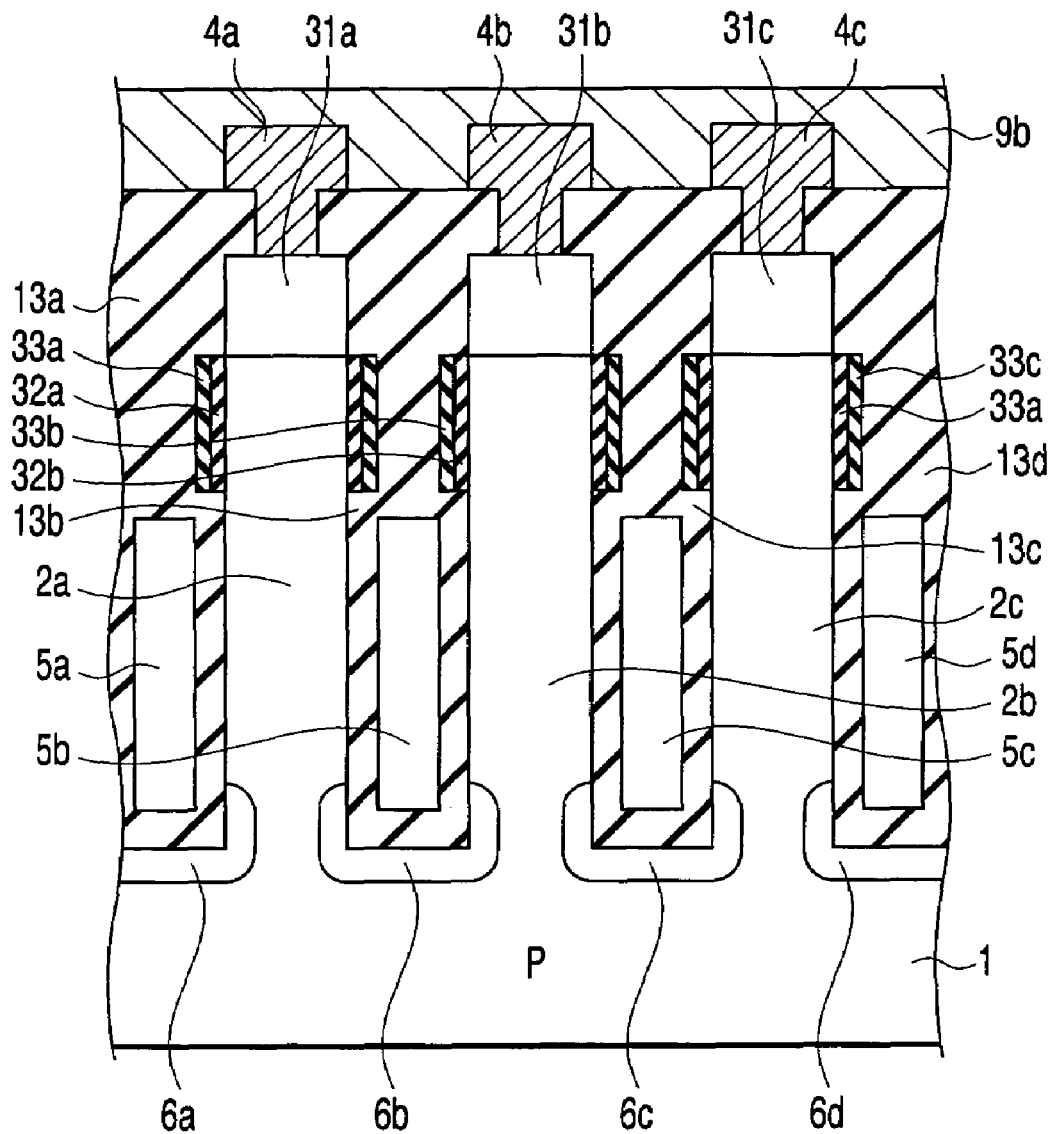
FIG. 12 is a schematic sectional view of a nonvolatile semiconductor memory device in a second embodiment.

A floating gate for accumulating a charge does not necessarily has to be shaped as described above. FIG. 12 shows an example wherein a nitride of an (O) NO film formed in a sidewall within silicon is used as a charge accumulation layer instead of a spherical floating gate. Manufacture is easier than in the first embodiment.

More particularly, in FIG. 12, 31 (31a to 31c) denotes $n^+$-type silicon layers (drain areas), 32 (32a to 32c) denotes silicon oxide films, and 33 (33a to 33c) denotes silicon nitride films. Other parts are similar to those in the first embodiment, so that 1 denotes a p-type silicon substrate, 2 denotes a p-type silicon column (channel area) and 6 denotes an $n^+$-type silicon layer (source area). That is, in the second embodiment, a polygate (corresponding to 5) and a memory nitride (corresponding to 32) are changed from a stacked type to a juxtaposed type in the SONOS-type nonvolatile semiconductor memory device. It is to be noted that the nitride film 32 and the oxide film 33 may be provided on opposite side surfaces of the silicon column 2 as in FIG. 12, or may be formed to enclose the silicon column 2.

The upper end of the nitride film 32 is aligned with the lower end of the drain area 31 in FIG. 12, but this is not a limitation. All that is required is that the lower end of the nitride film 32 partly overlaps at least the channel area.

(Modification)

Figure 13:
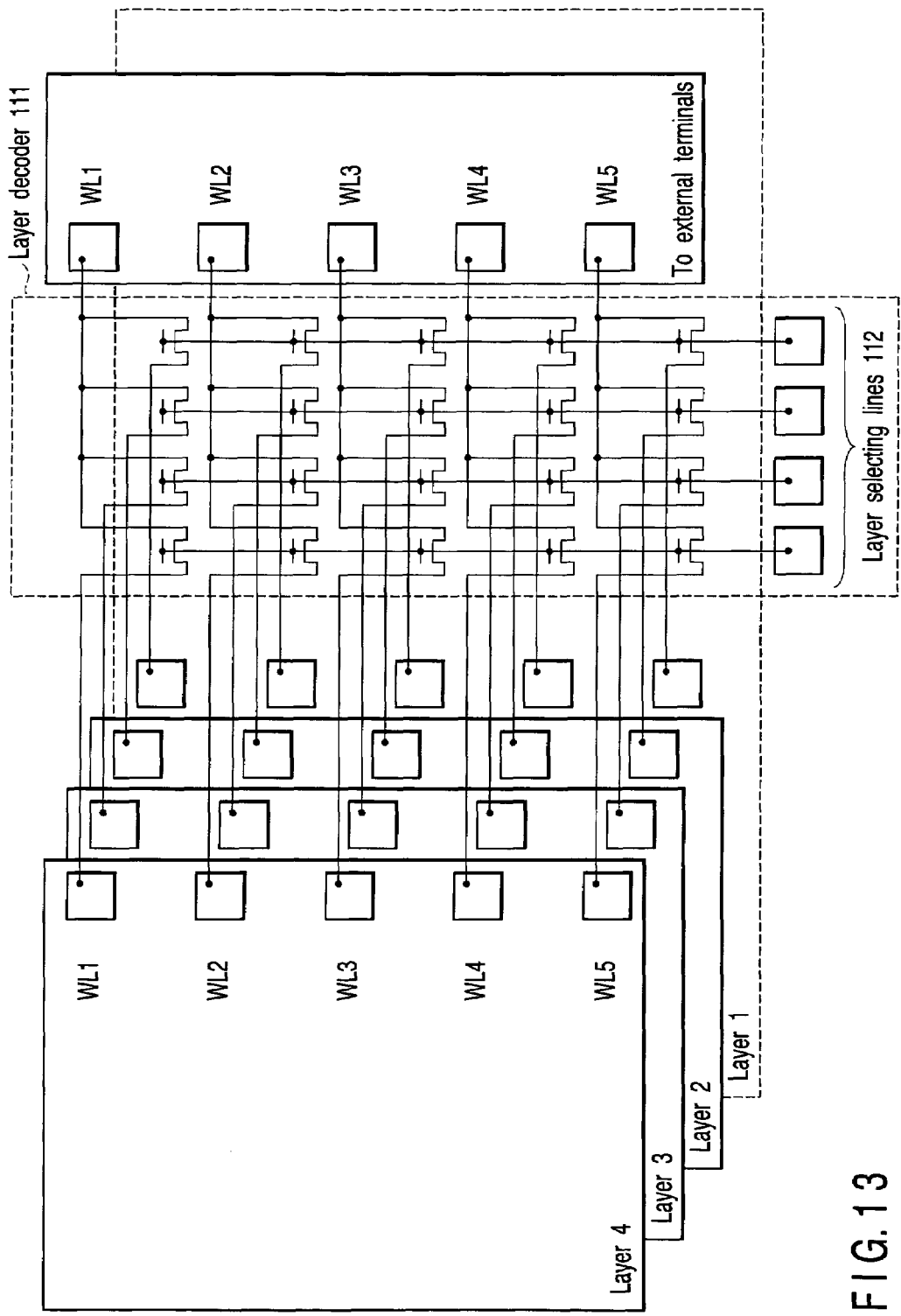
FIG. 13 concerns a third embodiment, and is a schematic configuration diagram wherein the semiconductor memory devices of the present invention are formed in multiple layers.

Monocrystalline silicon is used for the cells in the embodiments described above, but all that is required is that the modulation of diode characteristics can be checked by the charge in the floating gate in the operation of the present invention, so that polycrystalline silicon or amorphous silicon can also be applied to the cells. In such a case, it is also possible to put into practice a structure in which cells are stacked as shown in FIG. 13. This makes it possible to dramatically increase the amount of information per unit area without changing the minimum processing dimension in a process. Moreover, if a layer decoder 111 as shown in FIG. 13 is used, an external terminal can be electrically connected only to the word line (WL) of the layer selected by each layer selecting line 112 while an increase in the area can be minimized. In addition, when the present layer decoder 111 is used, the layer 1 alone is produced on monocrystalline silicon, and a selecting transistor in the layer decoder 111 is produced in the layer 1, such that a voltage drop and a resistance variation during selection can be conveniently minimized.

As described above through the embodiments, according to the present invention, it is possible to easily manufacture a high-density nonvolatile semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   a plurality of semiconductor columns arranged in a matrix form on the semiconductor substrate;
   a plurality of first conductive areas which are formed in a stripe form in a column direction on the semiconductor substrate between the plurality of semiconductor columns and which function as word lines;
   a plurality of second conductive areas formed at tops of the plurality of semiconductor columns, respectively;
   a plurality of bit lines connecting the plurality of second conductive areas in a row direction;
   a plurality of channel areas which are respectively formed in the plurality of semiconductor columns between the first conductive areas and the second conductive areas and which contact the first conductive areas and the second conductive areas;
   a plurality of third conductive areas which are continuously formed via first insulating films above the semiconductor substrate and opposite to the plurality of channel areas in the column direction between the plurality of semiconductor columns and which function as control gates; and
   a plurality of charge accumulation areas respectively formed via second insulating films at an upper portion of the plurality of channel areas at a position higher than the plurality of third conductive areas;
   wherein the plurality of charge accumulation areas comprise fourth conductive areas formed to be enclosed by insulators within the plurality of channel areas.

2. The device according to claim 1, wherein the plurality of second conductive areas are formed of a metal, and forms Schottky diodes between the plurality of second conductive areas and the plurality of channel areas.

3. The device according to claim 1, wherein the fourth conductive areas are made of a metal or semiconductor to which impurities are added.

4. The device according to claim 1, wherein the plurality of channel areas are made of silicon, and the plurality of second conductive areas are made of CoSi or NiSi.

5. A nonvolatile semiconductor memory device comprising a plurality of stacked layers, each of the stacked layers including the device according to claim 1.

6. A nonvolatile semiconductor memory device comprising:
   a semiconductor substrate;
   a plurality of semiconductor columns arranged in a matrix form on the semiconductor substrate;
   a plurality of first conductive areas which are formed in a stripe form in a column direction on the semiconductor substrate between the plurality of semiconductor columns and which function as word lines;
   a plurality of second conductive areas formed at tops of the plurality of semiconductor columns, respectively;
   a plurality of bit lines connecting the plurality of second conductive areas in a row direction;
   a plurality of channel areas which are respectively formed in the plurality of semiconductor columns between the first conductive areas and the second conductive areas and which contact the first conductive areas and the second conductive areas;
   a plurality of third conductive areas which are continuously formed via first insulating films above the semiconductor substrate and opposite to the plurality of channel areas in the column direction between the plurality of semiconductor columns and which function as control gates; and a plurality of charge accumulation areas respectively formed via second insulating films at an upper portion of the plurality of channel areas at a position higher than the plurality of third conductive areas, wherein the plurality of second conductive areas and the plurality of channel areas are formed of p-type silicon, and pin diodes are formed by i-type silicon layers and n-type silicon layers formed between the plurality of second conductive areas and the plurality of channel areas.

7. The device according to claim 6, wherein the plurality of charge accumulation areas comprise fourth conductive areas which are insulatively formed within the semiconductor columns and which have portions insulatively formed in at least the i-type silicon layers.

8. The device according to claim 7, wherein the fourth conductive areas are made of a metal or semiconductor to which impurities are added.

9. A nonvolatile semiconductor memory device comprising a plurality of stacked layers, each of the stacked layers including the device according to claim 6.

10. A nonvolatile semiconductor memory device comprising:
a semiconductor substrate;
a plurality of semiconductor columns arranged in a matrix form on the semiconductor substrate;
a plurality of first conductive areas which are formed in a stripe form in a column direction on the semiconductor substrate between the plurality of semiconductor columns and which function as word lines;
a plurality of second conductive areas formed at tops of the plurality of semiconductor columns, respectively;
a plurality of bit lines connecting the plurality of second conductive areas in a row direction;
a plurality of channel areas which are respectively formed in the plurality of semiconductor columns between the first conductive areas and the second conductive areas and which contact the first conductive areas and the second conductive areas;
a plurality of third conductive areas which are continuously formed via first insulating films above the semiconductor substrate and opposite to the plurality of channel areas in the column direction between the plurality of semiconductor columns and which function as control gates; and
a plurality of charge accumulation areas respectively formed via second insulating films at an upper portion of the plurality of channel areas at a position higher than the plurality of third conductive areas,
wherein the plurality of second conductive areas and the plurality of channel areas are formed of p-type silicon, and n-type silicon layers are formed between the plurality of second conductive areas and the plurality of channel areas, so that pnp diodes are formed.

11. The device according to claim 10, wherein the plurality of charge accumulation areas comprise fourth conductive areas which are formed within the semiconductor columns to be enclosed by insulators and which have portions enclosed by the insulators in at least the n-type silicon layers.

12. The device according to claim 11, wherein the fourth conductive areas are made of a metal or semiconductor to which impurities are added.

13. A nonvolatile semiconductor memory device comprising a plurality of stacked layers, each of the stacked layers including the device according to claim 10.

14. A nonvolatile semiconductor memory device comprising:
a semiconductor substrate;
a plurality of semiconductor columns arranged in a matrix form on the semiconductor substrate;
a plurality of first conductive areas which are formed in a stripe form in a column direction on the semiconductor substrate between the plurality of semiconductor columns and which function as word lines;
a plurality of second conductive areas formed at tops of the plurality of semiconductor columns, respectively;
a plurality of bit lines connecting the plurality of second conductive areas in a row direction;
a plurality of channel areas which are respectively formed in the plurality of semiconductor columns between the first conductive areas and the second conductive areas and which contact the first conductive areas and the second conductive areas;
a plurality of third conductive areas which are continuously formed via first insulating films above the semiconductor substrate and opposite to the plurality of channel areas in the column direction between the plurality of semiconductor columns and which function as control gates; and
a plurality of charge accumulation areas respectively formed via second insulating films at an upper portion of the plurality of channel areas at a position higher than the plurality of third conductive areas,
wherein the plurality of second conductive areas are formed of n-type silicon and the plurality of channel areas are formed of p-type silicon, and the charge accumulation areas are silicon nitride films which are formed via silicon oxide films formed on side surfaces of the semiconductor columns to include at least p-n junction surfaces between the plurality of second conductive areas and the plurality of channel areas.

15. The device according to claim 14, wherein the channel areas are fully depleted when a control voltage is applied to the control gates.

16. The device according to claim 14, wherein the first conductive areas are semiconductor layers to which impurities are added.

17. The device according to claim 14, wherein the first conductive areas are a metal.

18. The device according to claim 14, wherein the thickness of the channel areas is equal to or less than half of the height of the control gates.

19. A nonvolatile semiconductor memory device comprising a plurality of stacked layers, each of the stacked layers including the device according to claim 14.

* * * * *